United States Patent [19]
Inoue

[11] Patent Number: 5,233,310
[45] Date of Patent: Aug. 3, 1993

[54] MICROWAVE INTEGRATED CIRCUIT

[75] Inventor: Akira Inoue, Itami, Japan

[73] Assignee: Mitsubishi Denki Kabushiki Kaisha, Tokyo, Japan

[21] Appl. No.: 905,428

[22] Filed: Jun. 29, 1992

[30] Foreign Application Priority Data

Sep. 24, 1991 [JP] Japan ................... 3-274677

[51] Int. Cl.$^5$ ............................................. H03F 3/193
[52] U.S. Cl. ................................. 330/277; 330/286; 330/307
[58] Field of Search ................ 330/207 A, 277, 251, 330/286, 306, 307

[56] References Cited

U.S. PATENT DOCUMENTS

| | | | |
|---|---|---|---|
| 3,500,428 | 3/1970 | Allen | 343/854 |
| 4,683,443 | 7/1987 | Young et al. | 330/277 |

FOREIGN PATENT DOCUMENTS

| | | |
|---|---|---|
| 61-259560 | 11/1986 | Japan . |
| 63-48855 | 3/1988 | Japan . |
| 63-111659 | 5/1988 | Japan . |
| 63-140560 | 6/1988 | Japan . |
| 1-308060 | 12/1989 | Japan . |
| 2-119260 | 7/1990 | Japan . |
| 3-21101 | 1/1991 | Japan . |
| 1209609 | 10/1970 | United Kingdom . |
| 1336587 | 11/1973 | United Kingdom . |
| 1467387 | 3/1977 | United Kingdom . |
| 2104327 | 3/1983 | United Kingdom . |
| 2126015 | 3/1984 | United Kingdom . |

*Primary Examiner*—James B. Mullins
*Attorney, Agent, or Firm*—Leydig, Voit & Mayer

[57] ABSTRACT

In a hybrid microwave integrated circuit in which an FET and an LC resonance circuit are integrated, the LC resonance circuit includes an inductor and a capacitor disposed on a substrate having a smooth surface which ensures that the dimensional precision of the inductor will be in a range of ±several microns when it is formed on the substrate. Then, the substrate, on which the LC resonance circuit is formed, is mounted on or buried in a high frequency signal transmitting substrate. Therefore, variation in resonant frequency of the LC resonance circuit are reduced, whereby deteriorations in characteristics, such as efficiency, output power and the like, are reduced. In addition, since the LC resonance circuit is reduced in the size and cost of the whole circuit are reduced.

17 Claims, 10 Drawing Sheets

MICROWAVE INTEGRATED CIRCUIT

FIELD OF THE INVENTION

The present invention relates to microwave integrated circuits and, more particularly, to a microwave integrated circuit that includes an LC resonance circuit comprising an inductor and a capacitor.

BACKGROUND OF THE INVENTION

FIG. 12 is a plan view showing a prior art hybrid microwave integrated circuit which operates at a frequency of 500 MHz to several GHz. In FIG. 12, reference numeral 1 designates an alumina dielectric substrate which transmits signals in high frequency band. Distributed constant lines 6a and 6b are disposed on the substrate 1. The distributed constant lines 6a and 6b, an inductor 3, and a ground electrode (not shown) on the rear surface of the substrate 1 form a microstrip line. A chip capacitor 8 is disposed on the distributed constant line 6a and connected to the line 6b by a metal wire 5, for example, a gold wire having a diameter of about 25 microns. An FET 7 is disposed on a semiconductor substrate comprising GaAs, Si or the like and connected to the distributed constant line 6a by metal wires 5. The FET 7 comprises a region 7a in which a plurality of drains, gates, and sources alternate with each other, a wiring 7b connected to the drains, and a wiring 7c connected to the gates.

FIG. 13 schematically illustrates the integrate circuit of FIG. 12. In FIG. 13, the same reference numerals as in FIG. 12 designate the same or corresponding parts.

A description is given of the operation.

Signals amplified in the FET 7 are transferred to an LC resonance circuit comprising the capacitor 8 and the inductor 3 through the wiring 7b and the distributed constant line 6a. When the operating frequency of the integrated circuit is f, the LC resonance circuit resonates at a frequency of 2f, i.e., a frequency twice as high as the operating frequency. That is, when the inductance of the inductor 3 is L and the capacitance of the capacitor 4 is C, a value of LC is chosen to satisfy the following equation (1).

$$2f = \frac{1}{2\pi \sqrt{LC}} \quad (1)$$

Thus, a microwave signal having double frequency 2f is totally reflected by the LC resonance circuit comprising the capacitor 8 and the inductor 3 and returned to the FET 7, whereby the efficiency of the integrated circuit is improved. In this way, the double-frequency component in F-class operation is processed.

Meanwhile, in the above-described hybrid microwave integrated circuit including the LC resonance circuit, the precision of the capacitance of the capacitor 8 is ±10%, and the dimensional precision of the inductor 3 is ±25 to ±50 microns when the inductor is formed on an alumina substrate or the like having a rough surface. Therefore, the resonance frequency fr of the LC resonance circuit comprising the capacitor 8 and the inductor 3 varies by ±5 to ±10%, resulting in a reduction in the efficiency by several percent and a reduction in the output power by several dBm. The variation in the resonance frequency may be suppressed by increasing the width of the inductor 3 to improve the dimensional precision of the inductor 3. In this case, however, the whole circuit unfavorably increases in size, resulting in high costs.

The integrated circuit shown in FIG. 12 includes an LC resonance circuit processing only the double-frequency component. In order to further improve the efficiency of the device, a plurality of LC resonance circuits resonating at integer multiples of the operating frequency f, i.e., 2f, 3f, 4f, ..., are formed on the alumina dielectric substrate 1. In this case, however, since a plurality of inductors 3 and capacitors 8 are formed on the substrate 1, the device unfavorably increases in size. In addition, since variations in the resonance frequencies of the respective resonance circuits cause overlapping of the frequencies characteristics of the device, such as efficiency and output power, deteriorate all the more.

FIG. 14 is a cross-sectional view showing a monolithic microwave integrated circuit disclosed in Japanese Published Patent Application No. 3-21101. In FIG. 14, a second semiconductor substrate 32 having a high dielectric constant is disposed on a first semiconductor substrate 31 and a coplanar strip line 33 is disposed on the second substrate 32, whereby the length of the microwave circuit is reduced to miniaturize the device. FIG. 15 is a perspective view showing a semiconductor device disclosed in Japanese Published Patent Application No. 63-111659. In FIG. 15, an IC chip 34 is disposed on an Si substrate and GaAs chips 35 for high frequency operation are disposed on the IC chip 34, whereby a reduction in cost is achieved. However, these prior art devices cannot prevent deterioration in characteristics of ICs, such as efficiency and output power.

Meanwhile, methods for miniaturizing integrated circuits including inductors and capacitors have conventionally been proposed. FIG. 16 is a perspective view showing an MIM (Metal-Insulator-Metal) capacitor disclosed in Japanese Published Patent Application No. 63-48855. In FIG. 16, a capacitor 45 comprises a lower electrode 47, an insulating film 48, and an upper conductive layer 46, and the upper conductive layer 46 also serves as an inductor. In this structure, however, since an LC resonance circuit is formed by the MIM capacitor 45 in which the upper conductive layer 46 also serves as an inductor, a mutual coupling occurs between the inductor and the capacitor, resulting in an undesirable parasitic capacitance. Such a parasitic capacitance adversely affects characteristics of the microwave IC shown in FIG. 12 operating at a frequency of 500 MHz to several GHz. FIG. 17 is a cross-sectional view showing a semiconductor monolithic bias feeder circuit disclosed in Japanese Published Patent Application No. 63-140560. In FIG. 17, the bias feeder circuit comprises a spiral strip line inductor 36 disposed on a substrate, a dielectric insulating layer 37, and an uppermost metal layer 38 connected to a grounding pad. In this bias feeder circuit, however, since the MIM capacitor is disposed on an uneven surface due to the presence of the inductor on the substrate, the resistance of the MIM capacitance to pressure is poor, adversely affecting the characteristics of the device.

FIG. 18 is a plan view showing a microwave integrated circuit including an MIM capacitor disclosed in Japanese Published Patent Application No. 61-259560, in which the capacitance value of the capacitor is optimized after forming the capacitor on the substrate. In FIG. 18, a plurality of upper metal fingers 39 of the capacitor are connected outside of the capacitor region by leading electrodes 40 which join into a single electrode. The capacitance value of the capacitor is controlled by selectively cutting the leading electrodes 40. FIG. 19 is a perspective view showing a semiconductor device disclosed in Japanese Published Patent Application No. 1-308060. In FIG. 19, a plurality of upper metal layers 41 of an MIM capacitor are selectively connected by metal wires or the like to vary the capacitance. In addition, FIG. 20 is a plan view showing a plane and parallel MIM capacitor disclosed in Japanese Published Patent Application No. 2-119260. In FIG. 20, grounding conductor lines 42, which can be cut off in the final stage in the production process, are connected to an upper metal 43 and a lower metal 44. However, in the conventional microwave ICs having LC resonance circuits comprising the inductors and the capacitors shown in FIGS. 18 to 20, it is difficult to obtain a desired resonance frequency of the LC resonance circuit by only controlling the capacitance value of the capacitor, so that precise control of the resonance frequency is not achieved.

SUMMARY OF THE INVENTION

An object of the present invention is to provide a hybrid microwave integrated circuit that reduces variations in the resonance frequency, that suppresses deterioration of the characteristics of the circuit, such as efficiency and output voltage, and that reduces the size and the cost of the circuit.

Another object of the present invention is to provide a hybrid microwave integrated circuit that realizes an operation close to an F-class operation and that reduces the size and the cost of the circuit.

A further object of the present invention is to provide a microwave integrated circuit that includes an LC resonance circuit, comprising an MIM capacitor and an inductor without undesirable parasitic resistance, that reduces deterioration of the characteristics of the circuit, and that reduces the size of the circuit.

A still further object of the present invention is to provide a semiconductor integrated circuit for precisely controlling the resonance frequency of an LC resonance circuit comprising an inductor and a capacitor after forming the inductor and capacitor on a substrate.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a hybrid microwave integrated circuit, an LC resonance circuit comprising an inductor and a capacitor is disposed on a substrate having a smooth surface which ensures that the dimensional precision of the inductor will be in a range of ±several microns when it is formed on the substrate. The substrate, on which the LC resonance circuit is formed, is disposed on or buried in a high frequency signal transmitting substrate. Therefore, variations in the frequency of the resonance circuit are reduced, whereby deterioration of the characteristics, such as efficiency, output power and the like, are reduced. In addition, since the resonance circuit is reduced in size, size and cost of the whole circuit are reduced.

According to a second aspect of the present invention, in a hybrid microwave integrated circuit, a plurality of LC resonance circuits each comprising an inductor and a capacitor and resonating at frequencies that are integer multiples of the operating frequency of the hybrid microwave integrated circuit are disposed on a plurality of substrates having smooth surfaces which ensure that the dimensional precision of each inductor will be in a range of ±several microns when formed on the substrates. The substrates, on which the LC resonance circuits are formed, are disposed on or buried in a high frequency signal transmitting substrate. Therefore, variations in the frequency of each resonance circuit are reduced and a high frequency component is reflected at every desired phase with high precision, resulting in efficient operation close to the F-class operation.

According to a third aspect of the present invention, a microwave semiconductor integrated circuit includes an LC resonance circuit in which an inductor is disposed on a capacitor. Therefore, no parasitic capacitance is generated between the capacitor and the inductor due to the mutual coupling. In addition, the area of the substrate on which the LC resonance circuit is present is decreased.

According to a fourth aspect of the present invention, a microwave semiconductor integrated circuit includes an LC resonance circuit comprising a plurality of inductors connected to each other and a plurality of capacitors connected to each other. Therefore, the resonance frequency of the LC resonance circuit is precisely controlled by selectively cutting the connections.

According to a fifth aspect of the present invention, in a microwave semiconductor integrated circuit, electrodes, which are grounded in such a manner that only high frequency signal components are grounded, are disposed in the vicinity of signal electrodes of an LC resonance circuit. When the signal electrodes are connected to the grounded electrodes with a microwave probe, the frequency of the resonance circuit is measured.

DETAILED DESCRIPTION OF THE PREFERRED EMBODIMENTS

Figure 1:
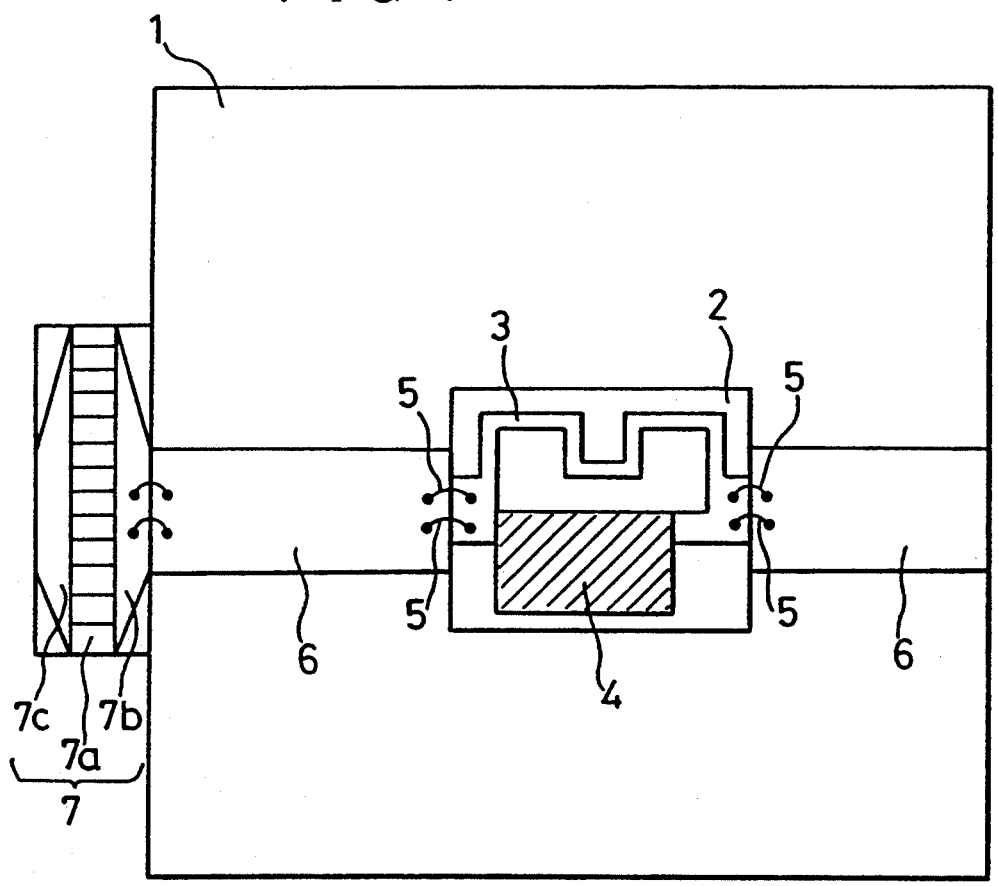
FIG. 1 is a plan view showing a hybrid microwave integrated circuit in accordance with a first embodiment of the present invention.
Figure 2:
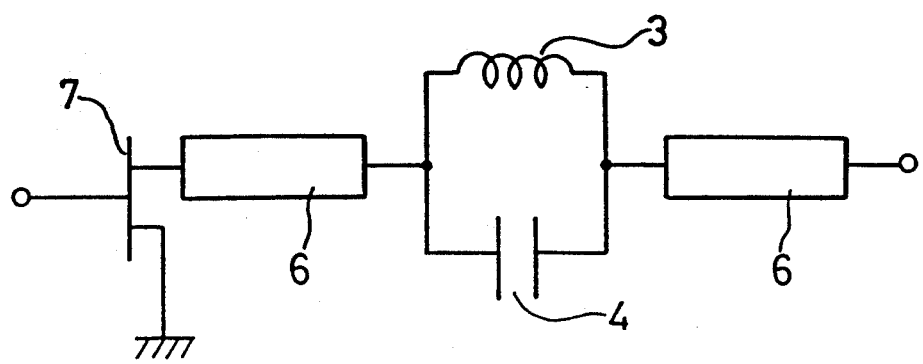
FIG. 2 is a diagram schematically showing the circuit of FIG. 1.
Figure 12:
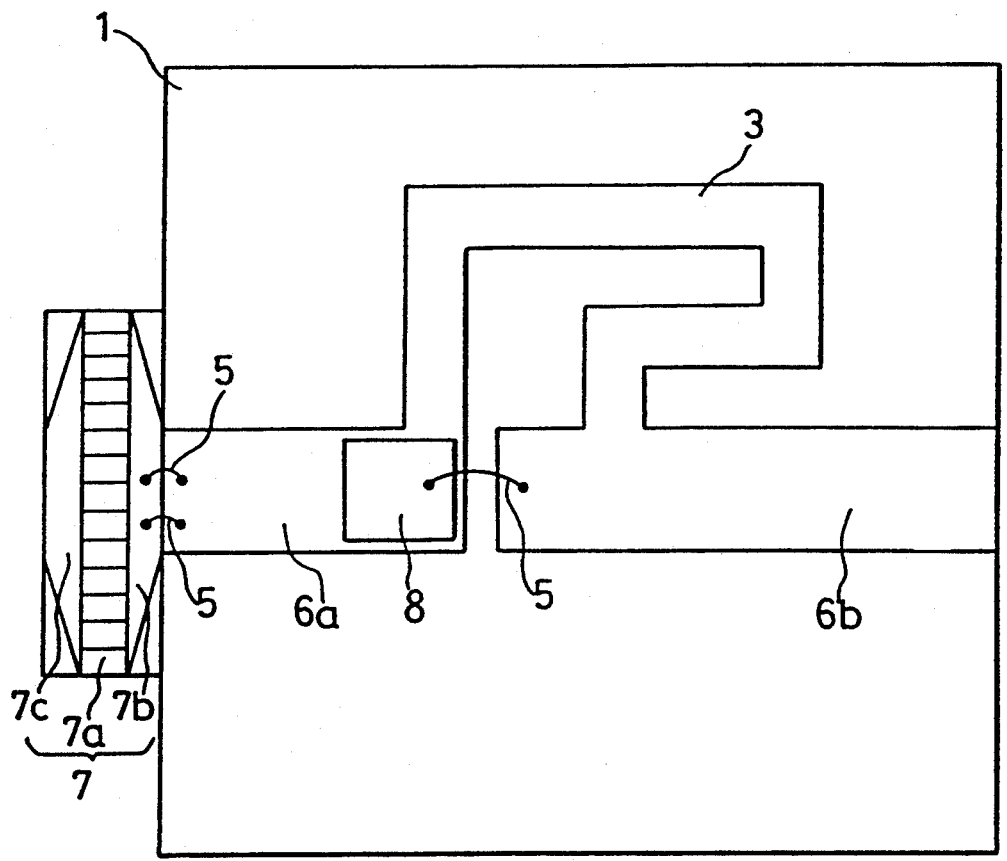
FIG. 12 is a plan view showing a hybrid microwave integrated circuit in accordance with the prior art.
Figure 13:
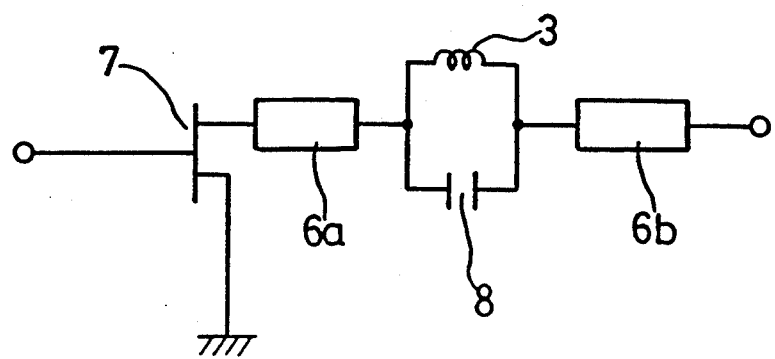
FIG. 13 is a diagram schematically showing the circuit of FIG. 12.
Figure 14:
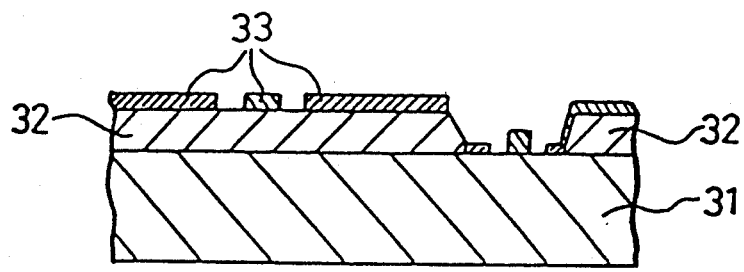
FIG. 14 is a cross-sectional view showing a monolithic microwave IC in accordance with the prior art.
Figure 15:
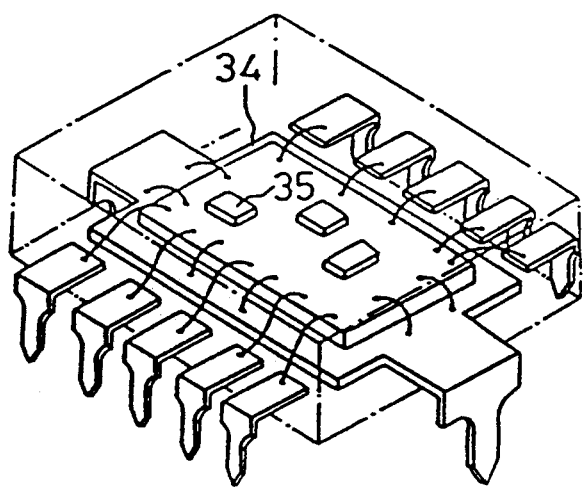
FIG. 15 is a perspective view showing a semiconductor device in accordance with the prior art
Figure 16:
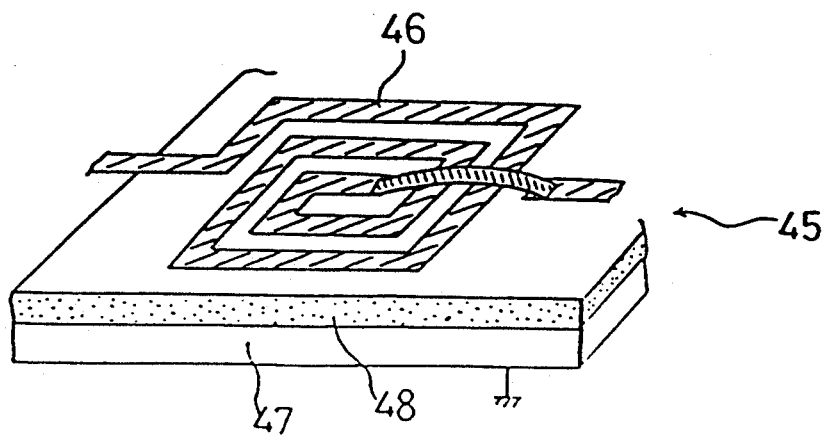
FIG. 16 is a cross-sectional view showing a semiconductor IC including an inductor and a capacitor in accordance with the prior art.
Figure 17:
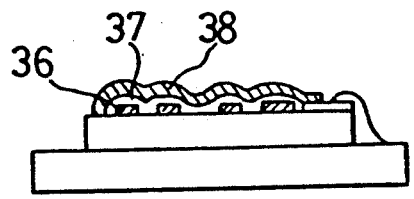
FIG. 17 is a cross-sectional view showing a semiconductor monolithic bias feeder circuit in accordance with the prior art.
Figure 18:
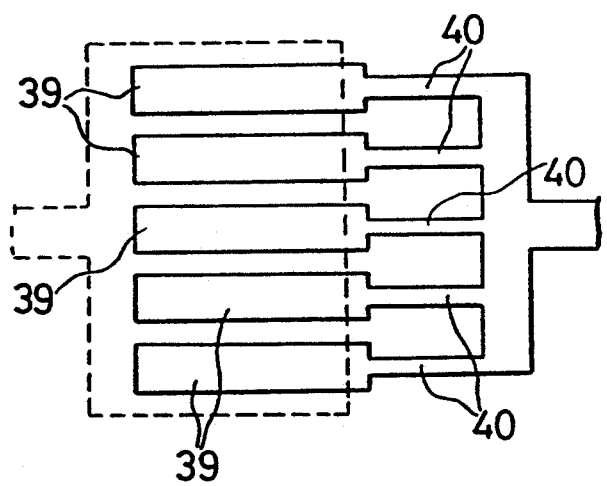
FIG. 18 is a plan view showing a microwave integrated circuit including an MIM capacitor in accordance with the prior art.
Figure 19:
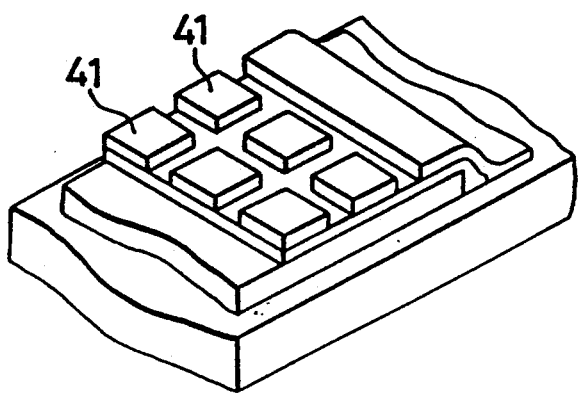
FIG. 19 is a perspective view showing a semiconductor device in accordance with the prior art.
Figure 20:
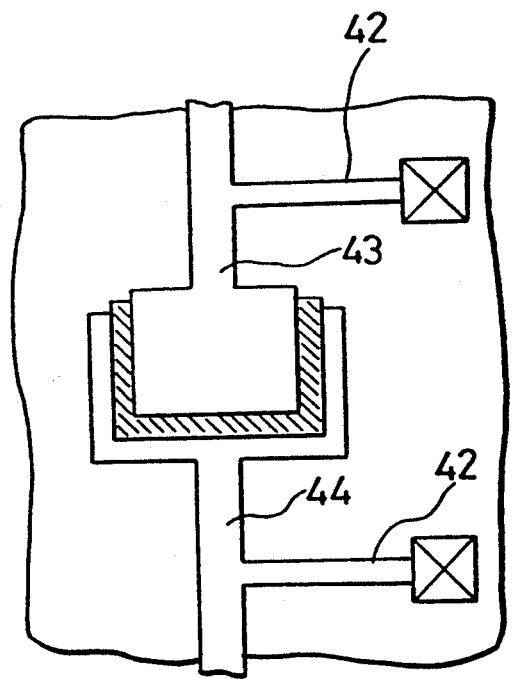
FIG. 20 is a plan view showing an MIM capacitor in accordance with the prior art.

FIG. 1 is a plan view showing a hybrid microwave integrated circuit operating at a frequency of 500 MHz to several GHz. In FIG. 1, the same reference numerals as in FIG. 12 designate the same or corresponding parts. An inductor 3 comprising a conductive material like Au, WSi, or Al and an MIM capacitor 4 are disposed on a second substrate 2. The second substrate 2 comprises sapphire, GaAs, Si or the like, and when the inductor 3 is formed on the substrate 2, the dimensional precision of the inductor 3 is in a range of ±several microns. The inductor 3 is electrically connected to the distributed constant lines 6 on the alumina dielectric substrate 1 by wire 5. The MIM capacitor 4 and the inductor 3 form an LC resonance circuit. The widths, thicknesses and the like of the inductor 3 and the capacitor 4 are selected so that the resonance frequency of the LC resonance circuit comprising the inductor 3 and the capacitor 4 is twice as high as the operating frequency of the microwave integrated circuit on the basis of the above-described equation (1). FIG. 2 is a diagram schematically showing the circuit of FIG. 1. As shown in FIG. 2, the inductor 3 and the capacitor 4 are connected in parallel with each other.

The hybrid microwave integrated circuit is fabricated as follows. First, the inductor 3 and the MIM capacitor 4 are formed on the second substrate 2 and the second substrate 2 is bonded to the alumina dielectric substrate 1. Then, the inductor 3 is connected to the distributed constant lines 6 by the wires 5. In the MIM capacitor 4, an insulating layer between upper and lower metal layers is thin, so that the capacitance of the MIM capacitor 4 is controlled more precisely than in the conventional chip capacitor, reducing the variation of the resonance frequency of the LC resonance circuit.

According to the first embodiment of the present invention, the LC resonance circuit comprising the inductor 3 and the MIM capacitor is disposed on the second substrate 2 which ensures a high dimensional precision of the inductor 3 in a range of ±several microns and then the second substrate is disposed on the first substrate 1, so that the LC resonance circuit is disposed on the first substrate 1 with a high dimensional precision. Therefore, the resonance frequency of the LC resonance circuit has less variation than in the conventional LC resonance circuit. In addition, the area of the first substrate 1 on which the LC resonance circuit is disposed is significantly reduced, whereby characteristics of the device, such as efficiency, output power and the like, are improved and the whole device is miniaturized.

Figure 3:
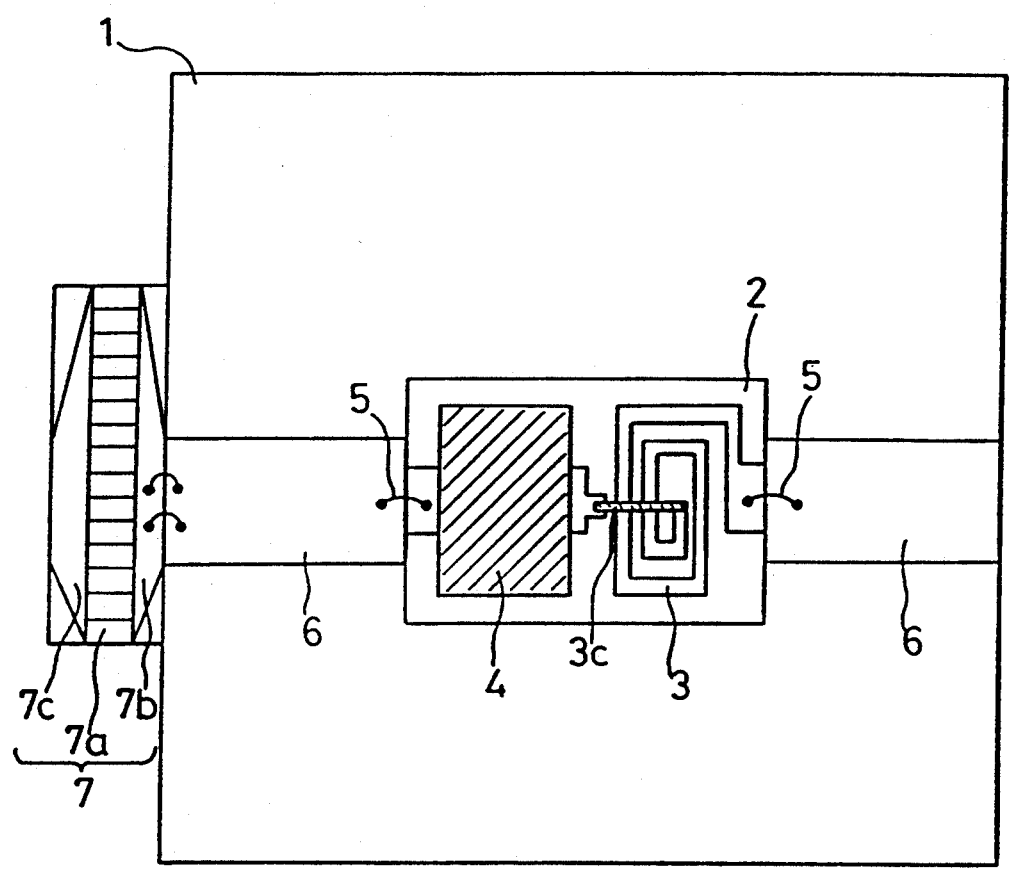
FIG. 3 is a plan view showing a hybrid microwave integrated circuit in accordance with a second embodiment of the present invention.
Figure 4:
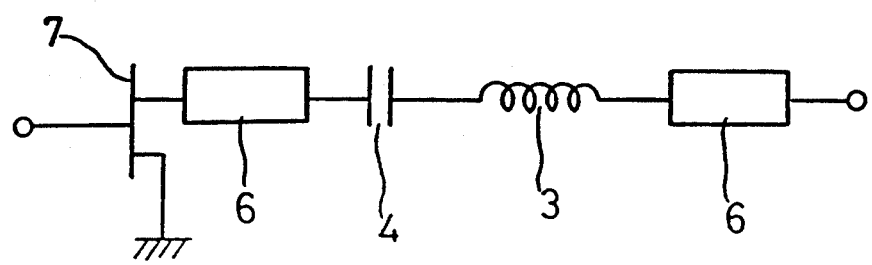
FIG. 4 is a diagram schematically showing the circuit of FIG. 3.

FIG. 3 is a plan view showing a hybrid microwave integrated circuit in accordance with a second embodiment of the present invention. In FIG. 3, the same reference numerals as in FIG. 1 designate the same or corresponding parts. Reference numeral 3c designates an airbridge connecting the inductor 3 and the capacitor 4. FIG. 4 schematically illustrates the circuit of FIG. 3.

According to the second embodiment of the present invention, the inductor 3 and the capacitor 4 are serially connected by the airbridge 3c on the second substrate 2 which ensures a high dimensional precision of the inductor 3 in a range of ±several microns. Also in this case, the same effects as described above are obtained.

Figure 5:
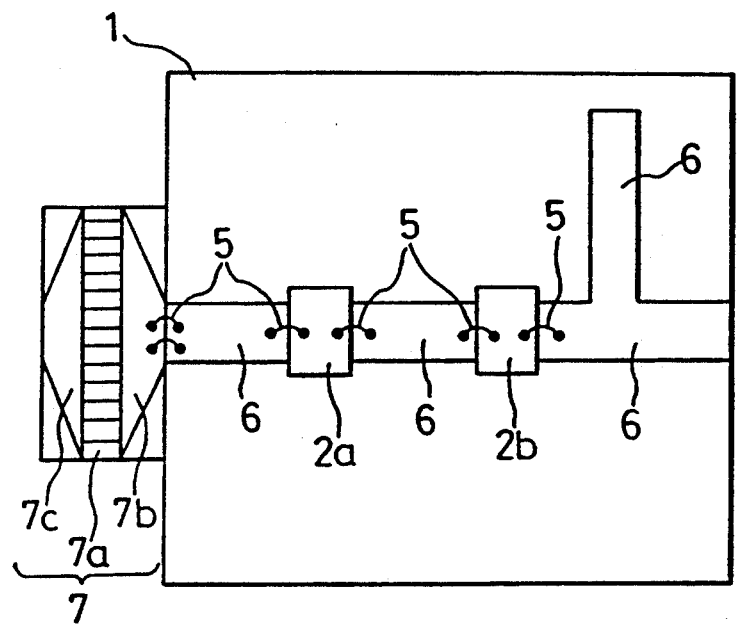
FIG. 5 is a plan view showing a hybrid microwave integrated circuit in accordance with a third embodiment of the present invention.
Figure 6:
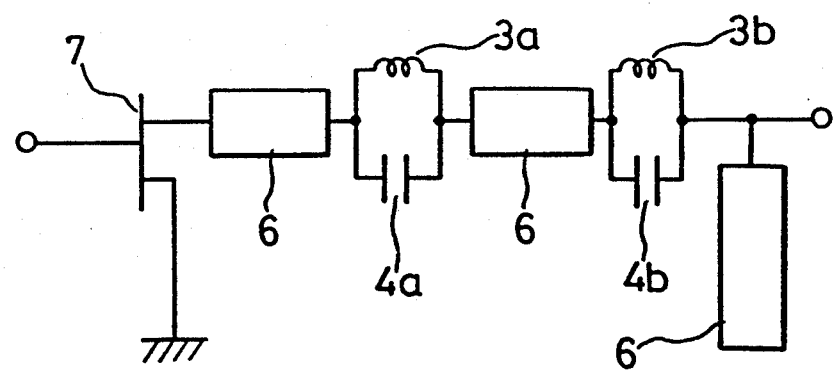
FIG. 6 is a diagram schematically showing the circuit of FIG. 5.

FIG. 5 is a plan view showing a hybrid microwave integrated circuit in accordance with a third embodiment of the present invention. FIG. 6 schematically illustrates the circuit of FIG. 5. In these figures, the same reference numerals as in FIG. 1 designate the same or corresponding parts. An inductor 3a and a capacitor 4a form a first LC resonance circuit on a second substrate 2a while an inductor 3b and a capacitor 4b form a second LC resonance circuit on a second substrate 2b so that the resonance frequencies of the first and second resonance circuits may an integer multiple of the operating frequency of the integrated circuit. The second substrates 2a and 2b are connected to distributed constant lines 6 by wires 5. For example, when the operating frequency is f, the first LC resonance circuit on the substrate 2a resonates at a frequency of 2f and the second LC resonance circuit on the substrate 2b resonates at a frequency of 3f. It is generally known that efficiency of a high power amplifier is improved if the high power amplifier is, provided with an output circuit in which impedance matches at the output side are optimized with respect to the operating frequency f and the higher harmonics having frequencies 2f, 3f..., as described in "Design Consideration for High-Efficiency GaAs FET Power Amplifier", Shingaku Giho, Vol. 82, No. 85, pp. 21 to 26, 1982. In this embodiment, in order to bring the output impedance close to 0 with respect to a signal having an operating frequency f and to increase output impedances with respect to the higher harmonics having frequencies 2f, 3f, substrate 2a and a wave having frequency 3f is totally reflected by the substrate 2b and a phase of each reflected wave is optimized by the distribution constant line 6.

According to the third embodiment of the present invention, the first LC resonance circuit comprising the inductor 3a and the capacitor 4a, whose resonance frequency is twice as high as the operating frequency, is disposed on the second substrate 2a which ensures a high dimensional precision of the inductor 3a in a range of ±several microns, and the second resonance circuit comprising the inductor 3b and the capacitor 4b, whose resonance frequency is three times as high as the operating frequency, is disposed on the second substrate 2b which ensures a high dimensional precision of the inductor 3b in a range of ±several microns. The second substrates 2a and 2b having the LC resonance circuits are disposed on the alumina dielectric substrate 1 which is used at the operating frequency f. Therefore, variations in the resonance frequencies of the LC resonance circuits are reduced and high frequency components are precisely reflected at every desired phase. As the result, the operation of the integrated circuit is close to the F-class operation.

While in the above-described third embodiment two LC resonance circuits which resonate at frequencies 2f and 3f, respectively, are described, more LC resonance circuits which resonate at frequencies 4f, 5f, 6f . . . may be provided. In this case, the operation of the integrated circuit is closer to the F-class operation and a higher efficiency of the circuit is achieved.

Figure 7A:
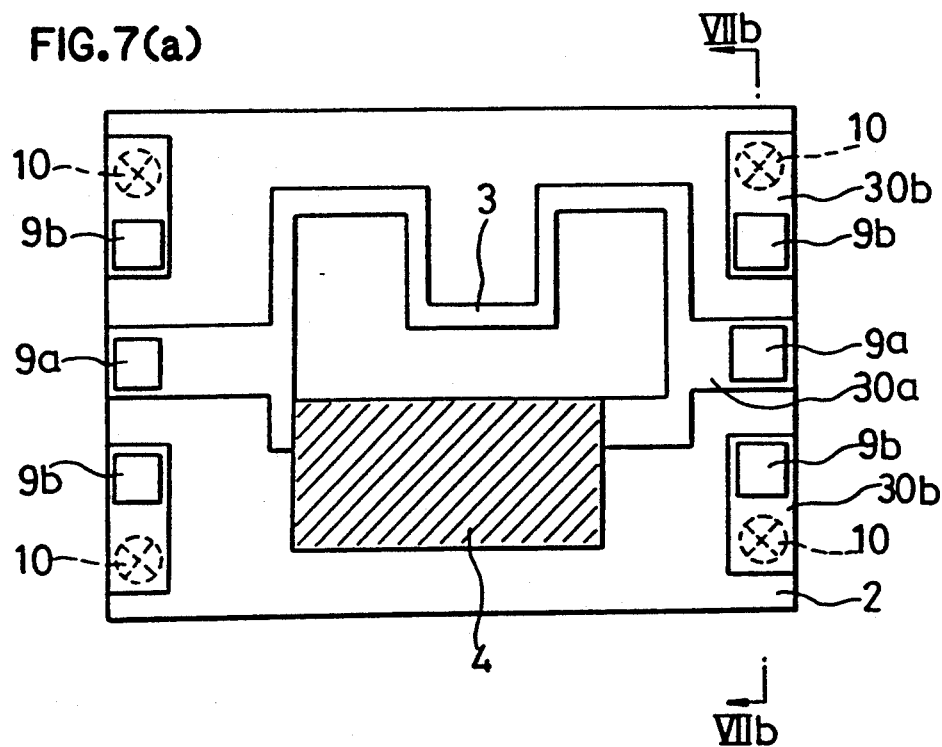
FIGS. 7(a) and 7(b) are a plan view and a cross-sectional view, respectively, showing an LC resonance circuit of a hybrid microwave integrated circuit in accordance with a fourth embodiment of the present invention.
Figure 7B:
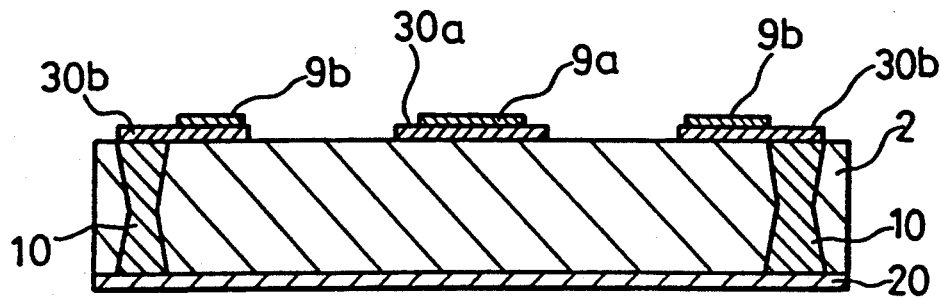

FIGS. 7(a) and 7(b) illustrate an LC resonance circuit of a hybrid microwave integrated circuit in accordance with a fourth embodiment of the present invention, in which FIG. 7(a) is a plan view and FIG. 7(b) is a cross-sectional view taken along a line VIIb—VIIb of FIG. 7(a). In the figures, the same reference numerals as in FIG. 1 designate the same or corresponding parts. Conductive films 30a and 30b are disposed on the second substrate 2. Signal electrodes 9a are disposed on the conductive film 30a and grounding electrodes 9b are disposed on the conductive films 30b. The grounding electrodes 9b are connected to a rear grounding electrode 20 through via holes 10 and grounded so that only a high frequency component is grounded.

According to the fourth embodiment of the present invention, the electrodes 9b are connected to the rear electrode 20 through the holes 10 and grounded, resulting in a coplanar strip line. In this structure, when the electrodes 9b are connected to the signal electrodes 9a on the upper surface of the substrate 2 by a coplanar microwave strip line probe, the resonance frequency of the LC resonance circuit is directly measured and an optimum resonance frequency is selected. Therefore, an LC resonance circuit having an optimum resonance frequency is mounted on the substrate, with a result that the efficiency of the device is further improved.

Figure 8:
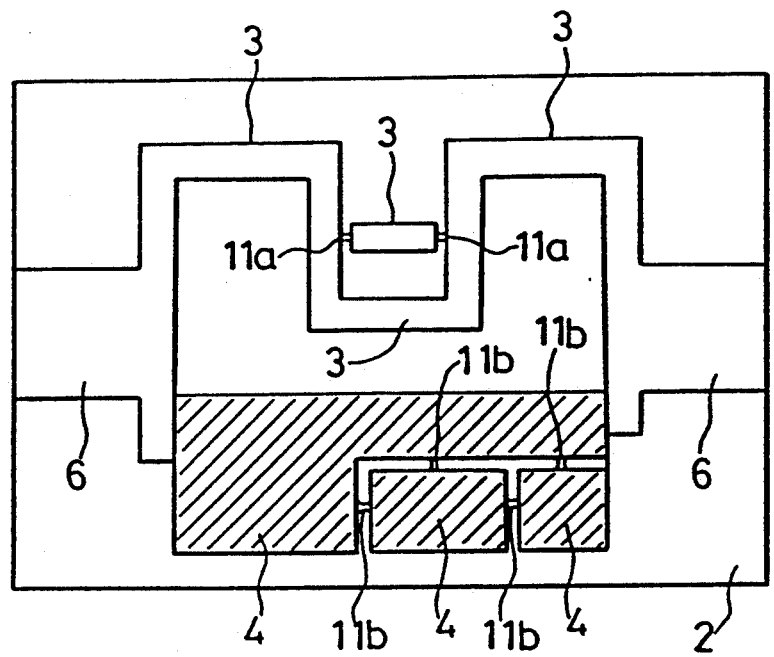
FIG. 8 is a plan view showing an LC resonance circuit of a hybrid microwave integrated circuit in accordance with a fifth embodiment of the present invention.
Figure 9:
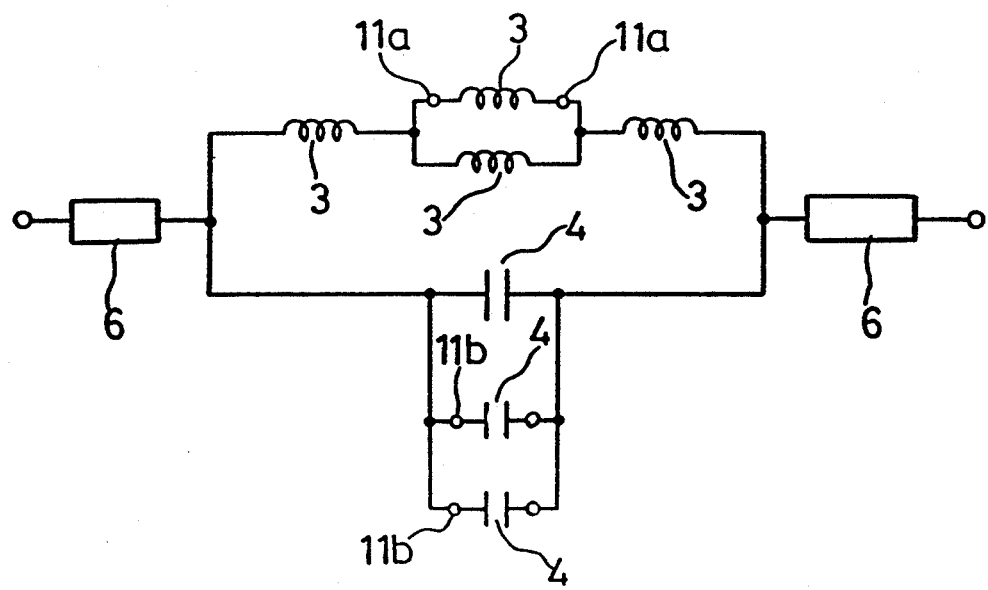
FIG. 9 is a diagram schematically showing the circuit of FIG. 8.

FIG. 8 is a plan view showing an LC resonance circuit of a microwave integrated circuit in accordance with a fifth embodiment of the present invention. FIG. 9 schematically illustrates the circuit of FIG. 8. In the figures, the same reference numerals as in FIG. 1 designate the same or corresponding parts. A plurality of inductors 3 are connected to each other by wires 11a and a plurality of capacitors 4 are connected to each other by wires 11b. The wires 11a and 11b can be cut by an FIB (focused ion beam) or laser. The inductors 3 are connected to the distributed constant lines 6 by wires or the like. The LC resonance circuit of this embodiment is mounted on a dielectric substrate comprising alumina or the like and incorporated in an integrated circuit, like the LC resonance circuits in the first to third embodiments.

According to the fifth embodiment, since the LC resonance circuit comprises a plurality of inductors 3 connected to each other by wires 11a and a plurality of capacitors 4 connected to each other by wires. The inductance and capacitance are varied by selectively cutting some of the wires 11a and 11b, whereby the resonance frequency of the LC resonance circuit is selected as desired. As the result, the efficiency of the device is further improved.

Figure 10:
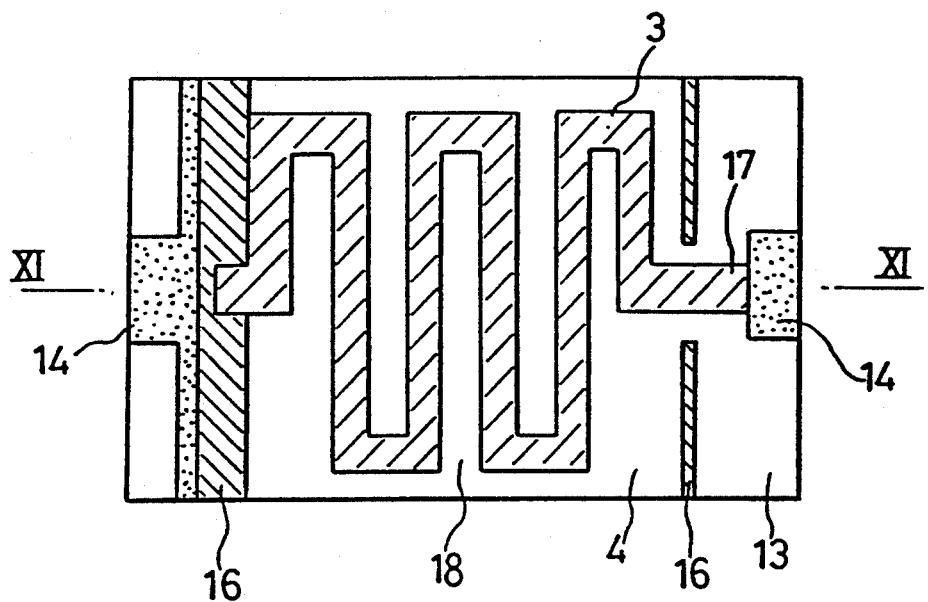
FIG. 10 is a plan view showing an LC resonance circuit of a hybrid microwave integrated circuit in accordance with a sixth embodiment of the present invention.
Figure 11:
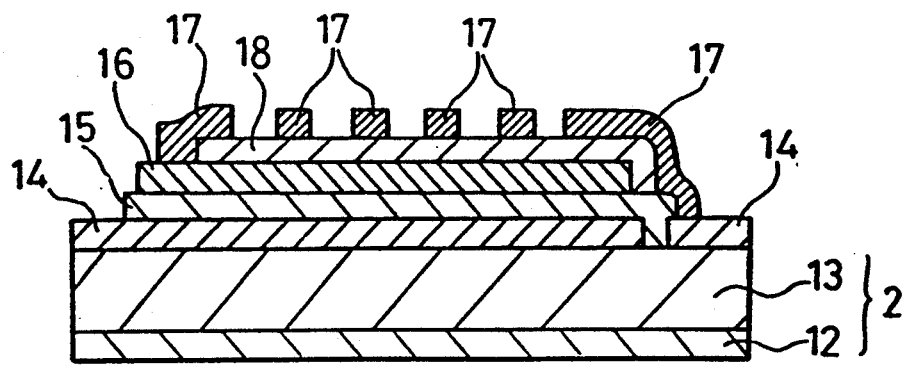
FIG. 11 is a cross-sectional view taken along a line X—X of FIG. 10.

FIG. 10 is a plan view showing an LC resonance circuit of a hybrid microwave integrated circuit in accordance with a sixth embodiment of the present invention. FIG. 11 is a cross-sectional view taken along a line XI—XI of FIG. 10. In the figures, the same reference numerals as in FIG. 1 designate the same or corresponding parts. Reference numeral 12 designates a rear conductive layer as a lower layer of the second substrate 2 and numeral 13 designates a dielectric layer comprising sapphire, Si, GaAs or the like as an upper layer of the second substrate 2. A first conductive film 14 is disposed o the dielectric layer 13. A first insulating film 15 is disposed on the first conductive film 14. A second conductive film 16 is disposed on the first insulating film 15. A second insulating film 18 is disposed on the second conductive film. A third conductive film 17 is disposed on the second insulating film 18. Preferably, the conductive films 14, 16, and 17 comprise Au, WSi, or Al and the insulating films 15 and 18 comprise $SiO_2$ or SiON.

The LC resonance circuit of this embodiment is fabricated as follows. First, the first conductive film 14, the first insulating film 15, and the second conductive film 16 are successively formed on the dielectric layer 13, whereby an MIM capacitor is produced. Then, the second insulating film 18 is formed on the second conductive film 16, and the third conductive film 17 is formed on the second insulating film 18 and patterned to form a meander line type inductor 3. Then, an end of the third conductive film 17 is connected to a part of the first conductive film 14. The LC resonance circuit thus fabricated is mounted on a first dielectric substrate comprising alumina or the like on which an FET is mounted and distributed constant lines are formed. Then, the inductor 3 is connected to the distributed constant lines by wires, resulting in an integrated circuit.

According to the sixth embodiment of the present invention, the MIM capacitor comprising the first conductive film 14, the first insulating film 15, and the second conductive film 16 is disposed on the second substrate 2 comprising sapphire, Si, GaAs or the like, and the meander line type inductor 3 is disposed on the upper conductive film 16 of the MIM capacitor, whereby an LC resonance circuit is produced. Therefore, there is no parasitic capacitance between the inductor 3 and the capacitor 4, so that variation in the resonance frequency of the LC resonance circuit is reduced. As the result, characteristics of the integrated circuit, such as efficiency, output power and the like, are improved. In addition, since the inductor is disposed on the capacitor, the area of the second substrate 2 is reduced, whereby the whole integrated circuit is miniaturized.

While in the above-described first to sixth embodiments of the present invention the second substrate 2, on which the LC resonance circuit is disposed, is disposed on the first substrate 1, the second substrate 2 may be buried in the first substrate 1 with the sam effects as described above.

As is evident from the foregoing description, according to the present invention, an LC resonance circuit comprising an inductor and a capacitor is disposed on a substrate having a smooth surface which ensures that the dimensional precision of the inductor will be in a range of ±several microns when it is formed on the substrate. The substrate, on which the LC resonance circuit is formed, is disposed on or buried in a high frequency signal transmitting substrate. Therefore, variation in the resonance frequency of the resonance circuit is reduced and the resonance circuit is miniaturized, resulting in a small-sized and inexpensive hybrid microwave integrated circuit in which deteriorations of characteristics are reduced.

In addition, according to the present invention, a plurality of LC resonance circuits each comprising an inductor and a capacitor and resonating at frequencies that are integer multiples of the operating frequency of the hybrid microwave integrated circuit are disposed on a plurality of substrates having smooth surfaces which ensure that the dimensional precision of each inductor will be in a range of ±several microns on the substrates. The substrates, on which the LC resonance circuits are formed, are disposed on or buried in a high frequency signal transmitting substrate. Therefore, variations in response frequency of each resonance circuit is reduced and a high frequency component is reflected at every desired phase with high precision, resulting in an efficient operation close to F-class operation.

In addition, according to the present invention, an LC resonance circuit comprises an MIM (Metal-Insulator-Metal) capacitor and an inductor disposed on an upper conductive film of the MIM capacitor. Therefore, no parasitic capacitance is present between the capacitor and the inductor. In addition, the area of the substrate on which the LC resonance circuit is present is decreased. As the result, deterioration of the characteristics of the circuit is reduced and a small-sized microwave integrated circuit with a high efficiency is achieved.

In addition, according to the present invention, a microwave semiconductor integrated circuit includes an LC resonance circuit comprising a plurality of inductors connected to each other and a plurality of capacitors connected to each other. The resonance frequency of the LC resonance circuit is precisely controlled by selectively cutting some of the connections. As the result, a microwave integrated circuit with a higher efficiency is achieved.

In addition, according to the present invention, electrodes, which are grounded in such a manner that only high frequency components are grounded, are disposed in the vicinity of electrodes of an LC resonance circuit. The frequency of the LC resonance circuit is directly measured by a probe and an optimum resonance frequency is selected. Therefore, an LC resonance circuit having an optimum resonance frequency is mounted on the substrate, resulting in a microwave integrated circuit with a higher efficiency.

What is claimed is:

1. A hybrid microwave integrated circuit comprising:
   a high frequency signal transmitting substrate;
   an FET disposed on the high frequency signal transmitting substrate and having an operating frequency;
   a second substrate having a smooth surface; and
   an LC resonance circuit comprising electrodes, an inductor, and a capacitor disposed on said second substrate, said smooth surface ensuring that dimensional precision of said inductor as formed is ±several microns wherein said second substrate is disposed on said high frequency signal transmitting substrate.

2. The hybrid microwave integrated circuit of claim 1 wherein said second substrate is selected from the group consisting of sapphire, GaAs, and Si.

3. The hybrid microwave integrated circuit of claim 1 wherein said capacitor has an MIM (metal-insulator-metal) structure.

4. The hybrid microwave integrated circuit of claim 3 wherein the LC resonance circuit has a resonance frequency, the resonance frequency being an integer multiple of the operating frequency of said FET.

5. The hybrid microwave integrated circuit of claim 4 wherein the operating frequency ranges from 500 MHZ to several GHz.

6. The hybrid microwave integrated circuit of claim 3 wherein said inductor is disposed on said MIM capacitor.

7. The hybrid microwave integrated circuit of claim 1 wherein said LC resonance circuit includes a plurality of said inductors connected in parallel with each other and a plurality of said capacitors connected in parallel with each other and connections connecting said inductors and capacitors that can be selectively cut to disconnect selected inductors and capacitors.

8. The hybrid microwave integrated circuit of claim 1 including electrodes disposed on said second substrate grounded only for high frequency signal components and disposed in the vicinity of said electrodes of the LC resonance circuit.

9. The hybrid microwave integrated circuit of claim 1 wherein said high frequency signal transmitting substrate is alumina.

10. A hybrid microwave integrated circuit comprising:
    a high frequency signal transmitting substrate;
    an FET disposed on said high frequency signal transmitting substrate and having an operating frequency;
    a plurality of second substrates, each second substrate having a smooth surface; and
    an plurality of LC resonance circuits, each comprising electrodes, an inductor, and a capacitor, each circuit resonating at a frequency that is an integer multiple of the operating frequency, being disposed on one of said plurality of second substrates, the smooth surfaces ensuring that dimensional precision of each of said inductors as formed is ±several microns wherein said second substrates are disposed on said high frequency signal transmitting substrate.

11. The hybrid microwave integrated circuit of claim 10 wherein said second substrates are selected from the group consisting of sapphire, GaAs, and Si.

12. The hybrid microwave integrated circuit of claim 10 wherein said capacitors have MIM (metal-insulator-metal) structures.

13. The hybrid microwave integrated circuit of claim 12 wherein said inductors are disposed on said MIM capacitors.

14. The hybrid microwave integrated circuit of claim 10 wherein the operating frequency ranges from 500 MHz to several GHz.

15. The hybrid microwave integrated circuit of claim 10 wherein each of said LC resonance circuits comprises a plurality of inductors connected in parallel with each other and a plurality of said capacitors connected in parallel with each other and including connections between said inductors and capacitors that can be selectively cut to disconnect selected inductors and capacitors.

16. The hybrid microwave integrated circuit of claim 10 including electrodes grounded only at high frequencies disposed in the vicinity of said electrodes of the LC resonance circuits.

17. The hybrid microwave integrated circuit of claim 10 wherein said high frequency signal transmitting substrate is alumina.

* * * * *